(12) United States Patent
Hiller (10) Patent No.: US 12,280,445 B2
(45) Date of Patent: Apr. 22, 2025

(54) MATERIAL PROCESSING METHOD AND MATERIAL PROCESSING SYSTEM FOR PERFORMING THE METHOD

(71) Applicant: Carl Zeiss Microscopy GmbH, Jena (DE)

(72) Inventor: Stephan Hiller, Koenigsbronn-Zang (DE)

(73) Assignee: Carl Zeiss Microscopy GmbH, Jena (DE)

( * ) Notice: Subject to any disclaimer, the term of this patent is extended or adjusted under 35 U.S.C. 154(b) by 793 days.

(21) Appl. No.: 17/556,070

(22) Filed: Dec. 20, 2021

(65) Prior Publication Data

US 2022/0193819 A1 Jun. 23, 2022

(30) Foreign Application Priority Data

Dec. 21, 2020 (DE) .......................... 102020134463.5

(51) Int. Cl.
*B23K 26/04* (2014.01)
*B23K 26/03* (2006.01)
*B23K 26/08* (2014.01)
*B23K 26/082* (2014.01)
*B23K 26/362* (2014.01)
(Continued)

(52) U.S. Cl.
CPC ............ *B23K 26/04* (2013.01); *B23K 26/032* (2013.01); *B23K 26/082* (2015.10); *B23K 26/083* (2013.01); *B23K 26/362* (2013.01); *H01J 37/20* (2013.01); *H01J 37/222* (2013.01); *H01L 21/268* (2013.01); *H01L 21/67282* (2013.01); *H01L 23/544* (2013.01); *B23K 2101/36* (2018.08); *H01J 37/28* (2013.01); *H01L 2223/54426* (2013.01)

(58) Field of Classification Search
None
See application file for complete search history.

(56) References Cited

U.S. PATENT DOCUMENTS 3,657,085 A * 4/1972 Hoffmeister .......... C03C 23/004
204/157.44
5,905,266 A 5/1999 Larduinat et al.
(Continued)

FOREIGN PATENT DOCUMENTS

DE 10 2010 008 296 A1 8/2011

OTHER PUBLICATIONS

German Office Action, with translation thereof, for corresponding DE application No. 10 2020 134 463.5 dated Sep. 2, 2021.

*Primary Examiner* — Geoffrey S Evans
(74) *Attorney, Agent, or Firm* — Fish & Richardson P.C.

(57) ABSTRACT

A material processing system includes a particle beam column for directing a particle beam at a first processing region and a laser scanner for directing a laser beam at a second processing region. A method for operating the material processing system includes: scanning a first mark placed on an object with the particle beam; scanning the first mark with the laser beam for a first time and producing a second mark on the object with the laser beam; scanning the second mark with the particle beam; and scanning the first mark with the laser beam for a second time and removing material of the object with the laser beam based on the scanning of the second mark with the particle beam.

20 Claims, 4 Drawing Sheets

(51) Int. Cl.
  *H01J 37/20* (2006.01)
  *H01J 37/22* (2006.01)
  *H01L 21/268* (2006.01)
  *H01L 21/67* (2006.01)
  *H01L 23/544* (2006.01)
  *B23K 101/36* (2006.01)
  *H01J 37/28* (2006.01)

(56) References Cited

U.S. PATENT DOCUMENTS

| | | |
|---|---|---|
| 8,841,579 B2 | 9/2014 | Doemer |
| 2007/0003128 A1* | 1/2007 | Anderson ............ H05K 1/0269 |
| | | 382/151 |
| 2010/0051828 A1 | 3/2010 | Doemer et al. |
| 2011/0198326 A1 | 8/2011 | Doemer |
| 2013/0323937 A1* | 12/2013 | Kuebler ............... B23K 26/361 |
| | | 438/798 |
| 2013/0341313 A1* | 12/2013 | Himmelsbach ........ B23K 26/70 |
| | | 219/121.86 |
| 2017/0263416 A1 | 9/2017 | Biberger et al. |

* cited by examiner

MATERIAL PROCESSING METHOD AND MATERIAL PROCESSING SYSTEM FOR PERFORMING THE METHOD

CROSS-REFERENCE TO RELATED APPLICATION

This application claims benefit under 35 U.S.C. § 119 to German Application No. 10 2020 134 463.5, filed Dec. 21, 2020. The contents of this application is hereby incorporated by reference in its entirety.

FIELD

The disclosure relates to a material processing method and to a material processing system for performing the material processing method.

BACKGROUND

Many conventional material processing system includes an electron microscope having an electron beam column for scanning an electron beam over a first processing region of an object and detecting electrons generated at the object by the scanning electron beam in order to produce an electron microscopy image of the object. The conventional system furthermore includes an ion beam column for directing an ion beam at selectable locations in the first processing region in order to remove material from the object at that location. The material processing system can be used for exposing regions of interest on an object by way of material removal with the ion beam in order to be able to generate an electron microscopy image of the exposed region of interest using the electron microscope. The region of interest in the object can be, for example, a circuit element in a packaged or potted integrated circuit.

The removal of material with the ion beam is precisely controllable, which means that even small or thin structures can be relatively precisely exposed in desired regions of the object. However, in general, the material removal rate that is achievable with the processing by way of an ion beam is low, with the result that the time expenditure for exposing regions of interest located under the surface of the object is significant.

Many conventional material processing systems therefore additionally include a laser scanner for directing a laser beam at selectable locations in a second processing region in order to remove material from the object, if it is arranged in the second processing region, with a removal rate that is greater than the removal rate that is achievable with the ion beam.

Although the material removal rate that is achievable with the laser beam is greater than the removal rate that is achievable with the ion beam, the precision that is achievable during the material removal with the laser beam is, in general, significantly lower than the precision that is achievable during the material removal with the ion beam. For this reason, the laser beam is used to remove material from the object in a manner such that the region of interest usually continues to be covered by remaining material, which is kept as security against damage to the region of interest. This material that has been kept can then be removed by material removal with the ion beam in order to expose the region of interest. Due to the material removal rate of the ion beam, which is low compared to the laser beam, the removal of the remaining material that is kept as security also often takes a significant amount of time.

SUMMARY

The present disclosure proposes a material processing method and a corresponding material processing system in which the material removal by way of a laser beam and the material removal by way of an ion beam for exposing a region of interest on an object is possible in a comparatively short period of time.

The disclosure proposes a material processing method for a material processing system, including at least one particle beam column and a laser scanner.

According to embodiments of the disclosure, the at least one particle beam column is configured to direct at least one particle beam at a first processing region, and the laser scanner is configured to direct a laser beam at a second processing region. The second processing region can overlap the first working region. In order to reduce (e.g., avoid) contamination of the electron beam column and/or the ion beam column with particles that may be generated during the processing of the object with the laser beam, the second working region can be arranged at a distance from the first processing region. If desired, other possible features, such as stops that can be positionable in particular as desired, can also offer protection against such contamination.

According to embodiments, the at least one particle beam column includes an electron beam column, which is configured to direct an electron beam at the first processing region. The electron beam can be used to remove material from an object arranged in the first processing region. For this purpose, the material processing system can include a supply device for process gas in order to supply a suitable process gas, which is activable by the electron beam, to the first processing region in order to remove material from the object by etching. The electron beam can also be scanned over a scanning region contained in the first processing region, wherein signals generated during the scanning by the electron beam that is incident on the object, such as backscattered electrons, are detected in order to generate an electron microscopy image representing, for example, the intensities of the signals that are detected in a spatially resolved manner. In this case, the electron beam column provides the function of an electron microscope.

The at least one particle beam column can furthermore include an ion beam column, which is configured to direct an ion beam at the first processing region. The ion beam can be used to remove material from the object arranged in the first processing region, for which purpose a process gas can likewise be supplied. The ion beam can furthermore also be used to generate signals at the object, such as electrons, which are detected in order to generate an image from the intensities, which are detected in a spatially resolved manner, of the generated signals. In this case, the ion beam column provides the function of an ion microscope.

According to exemplary embodiments, the material processing system includes both an electron microscope and an ion beam column, which are arranged such that the electron beam and the ion beam can both be directed at least at parts of the first processing region.

The laser scanner is configured to direct the laser beam at selectable locations in the second processing region. In particular, the laser beam can be switched on and off and can then be switched on for material removal from the object if the beam path of the laser scanner is set such that it is directed at a desired location on the object. The laser beam can be a pulsed laser beam. In particular, a pulse duration of the generated laser pulses can be in the range of nanoseconds. According to exemplary embodiments, the pulse duration lies in the range of femtoseconds. At such short pulse durations, comparatively precise material processing is possible because material on which the laser beam is incident on the surface of the object is removed by evaporation and other mechanisms without a large volume of the material remaining on the object being impaired or destroyed by a thermal effect. Consequently, laser scanners generating short laser pulses for example in the order of femtoseconds are particularly suitable for use in embodiments of the material processing system and of the material processing method, since material removal with the laser beam can be performed up to the close vicinity of the region of interest.

According to exemplary embodiments, the material processing method includes scanning a first mark placed on the object with the laser beam for a first time and producing a second mark on the object with the laser beam. Before the first mark is scanned for a first time, the object can be moved into the second processing region by way of a transport system. According to exemplary embodiments, the first mark has at this time point already been placed at the object.

According to exemplary embodiments, the scanning of the first mark with the laser beam for a first time includes determining a position of the first mark in a coordinate system of the laser scanner. This means that the first mark is configured such that it is suitable for being recognized as a mark upon scanning with the laser beam by way of the laser scanner, with the result that the position of the first mark in the coordinate system of the laser scanner is determinable.

The second mark is produced on the object by way of the laser beam, for example by removing material from the object by way of the laser beam, wherein the removed material volume has a predetermined shape, for example the shape of a line, a cross, a plurality of points or another geometric shape. According to exemplary embodiments, the second mark produced by way of the laser beam is not necessarily suitable for being recognized by the laser scanner as a mark. According to exemplary embodiments, producing the second mark includes fixing a location in the coordinate system of the laser scanner based on the scanning of the first mark with the laser beam, and directing the laser beam at the location determined in the coordinate system of the laser scanner. The location in the coordinate system of the laser scanner can be based, for example, on a model of the geometry of the object. The model of the geometry of the object can be, for example, a CAD model of the object or an image of the object that was registered into the coordinate system of the laser scanner based on the determined position of the first mark.

According to exemplary embodiments, the material processing method furthermore includes scanning the first mark with the at least one particle beam. According to exemplary embodiments, the object was moved into the first processing region by the transport system before the mark is scanned with the at least one particle beam. The first mark can be scanned with the at least one particle beam before or after the first mark is scanned with the laser beam and the second mark is produced with the laser beam.

According to exemplary embodiments, the material processing method furthermore includes scanning the second mark with the at least one particle beam. According to exemplary embodiments, the object was moved into the first processing region by the transport system before the second mark is scanned with the at least one particle beam.

According to exemplary embodiments, scanning the first mark with the at least one particle beam includes determining a position of the first mark in a coordinate system of the at least one particle beam column. Accordingly, scanning the second mark with the at least one particle beam can include determining a position of the second mark in the coordinate system of the at least one particle beam column. That means that the first mark and/or the second mark can be recognizable in each case as a mark upon scanning with the at least one particle beam. This can be the case for example if the first or second mark in a particle-optical image, which is generated during the scanning of the mark with the particle beam, is recognizable with sufficient contrast. According to exemplary embodiments, the first mark is recognizable as a mark upon scanning with the laser beam, while the second mark does not necessarily have to be recognizable or detectable by scanning with the laser beam. For this purpose, the first mark can include for example a combination of a light detector for detecting the light of the laser beam and a mechanical stop, which is partially shading the light detector.

According to exemplary embodiments, the material processing method furthermore includes determining a position of the second mark relative to the position of the first mark based on the scanning of the first mark and the scanning of the second mark with the at least one particle beam.

According to exemplary embodiments, the mark used in the method, that is to say the first mark and/or the second mark, can be configured such that a position and an orientation of the mark can be determined in the coordinate system of the laser scanner and in the coordinate system of the at least one particle beam column. For this purpose, the mark can have a spatial extent and a predetermined geometric shape, such as for example the shape of a dash, a cross, a circle, a triangle or another geometric shape. In particular, the mark can also include a plurality of parts that can be arranged as partial marks at a distance from one another. For example, two, three or more partial marks can be provided. In this case, the partial marks may be configured such that their orientation is not determinable by way of the laser beam or the at least one particle beam column. However, the orientation of the mark that includes a plurality of such partial marks is determinable by scanning with the laser scanner or scanning with the at least one particle beam.

According to exemplary embodiments, the material processing method furthermore includes scanning the first mark with the laser beam for a second time and removing material of the object with the laser beam based on the scanning of the first mark with the at least one particle beam and the scanning of the second mark with the at least one particle beam. The result of this is that the removal of the material using the laser beam is possible with a high degree of precision and thus in particular up to the close vicinity of a region of interest of the object.

According to exemplary embodiments, the material processing method includes removing material of the object with the at least one particle beam after the removal of material of the object with the laser beam. The particle beam used for this can be an ion beam or an electron beam. Material of the object is removed with the at least one particle beam in order to expose on the object a region of interest in the object. Accordingly, the material processing method can furthermore include scanning at least one part of the object with the at least one particle beam after the removal of material of the object with the at least one particle beam and detecting signals that are generated at the object due to the scanning with the particle beam. The particle beam used for the scanning of the part of the object with the at least one particle beam can be an electron beam or an ion beam. The material processing method can then furthermore include generating an image based on the detected signals and presenting the generated image using a display medium, such as a screen. The material processing method can furthermore include storing the generated image in a storage medium, such as for example a hard disk memory, a solid-state disk or cloud storage.

Since the removal of the material from the object with the laser beam is possible with a high degree of precision, the material can be removed with the laser beam up to the close vicinity of the region of interest, wherein only a small or thin material volume is left behind in front of the region of interest for security purposes. This small or thin material volume can then be removed within a relatively short period of time with the at least one particle beam to expose the region of interest and to generate therefrom for example an image with the at least one particle beam by scanning.

According to exemplary embodiments, the material processing method includes fixing a location relative to a position of the first mark, which is determined based on the scanning of the first mark with the laser beam, in the coordinate system of the laser scanner and directing the laser beam at the location in order to produce the second mark. This location can be fixed for example based on a model of the geometry of the object, such as for example a CAD model of the object. The method can then furthermore include determining a position of the second mark relative to the first mark based on the scanning of the second mark with the at least one particle beam. If the laser beam is in fact directed at the specific location on the object by way of the laser scanner during the production of the second mark, the position of the location at which the laser beam is directed should, in general, coincide with the position of the fixed location. In practice, technical inadequacies of the systems used, such as defects in the optical unit and in the alignment of the laser beam of the laser scanner, thermal effects and imprecise adjustments can result in the laser beam, when it is perceived to be directed at a fixed location, actually being directed at a location that deviates therefrom. Accordingly, in some cases, the second mark is produced by the laser beam not necessarily at the fixed location but at a location whose position is slightly different from the position of the fixed location. This deviation can be determined by the scanning of the second mark by way of the at least one particle beam. Accordingly, the method can further make provision for the fact that the removal of material of the object with the laser beam is based on a difference between the position of the second mark that is determined by scanning the second mark with the at least one particle beam and the position of the location that is fixed for producing the second mark with the laser beam. In particular, the alignment of the laser beam with locations at which removal of material is intended to take place can be based on the difference.

According to exemplary embodiments, provision is made for the scanning of the first mark with the at least one particle beam and scanning at least one part of the object with the at least one particle beam to take place before the first scanning of the first mark with the laser beam and before the production of the second mark. Before this measure, the object can have been moved into the first processing region using the transport system.

By scanning the part of the object with the at least one particle beam, the surface shape of the part of the object and the position and orientation of the surface of the object relative to the region of interest can be captured. Accordingly, the method can then include fixing a position on the surface of the object relative to the position of the first mark, which is determined based on the scanning of the first mark with the at least one particle beam, wherein the fixing is based on the scanning of the part of the object with the at least one particle beam. Fixing the location in the coordinate system of the laser scanner at which the laser beam is directed for producing the second mark can then be based in the coordinate system of the laser scanner on the scanning of the first mark with the laser beam and the fixed position. In this way, it is possible to achieve that the material volume to be removed with the laser beam is aligned precisely relative to the region of interest of the object.

BRIEF DESCRIPTION OF THE DRAWINGS

Embodiments of the disclosure will be explained in more detail below with reference to figures, in which.

EXEMPLARY EMBODIMENTS

Figure 1:
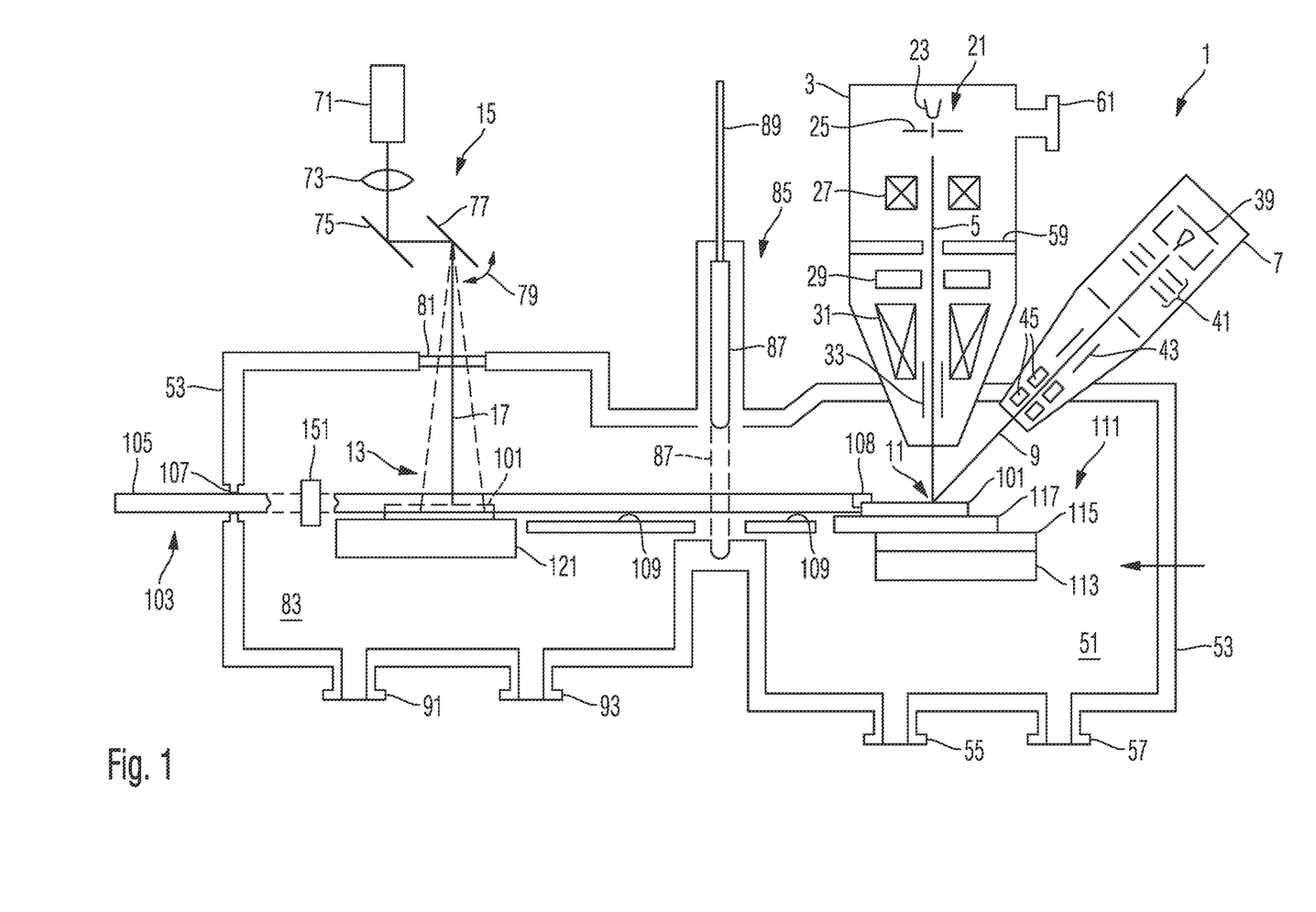
FIG. 1 shows a schematic cross section of a material processing system according to an embodiment.

FIG. 1 is a schematic illustration of a material processing system 1 in accordance with an embodiment.

The material processing system 1 includes two particle beam columns, specifically an electron beam column 3 for generating an electron beam 5 and an ion beam column 7 for generating an ion beam 9, which is directed, like the electron beam 5, at selectable locations within a scanning region 11.

The electron beam column 3 serves for directing the electron beam 5 at a region of interest of an object arranged within a processing region 11 and for detecting secondary electrons or backscattered electrons. When the electron beam 5 is directed at different locations on the object and detected intensities are assigned to those locations, an electron microscopy image of the region of interest of the object can be generated.

The ion beam column 7 is used to direct the ion beam 9 at selected locations. The ion beam 9 can remove material from the object at these locations. It is here also possible to additionally supply the processing location with a process gas, which is activated by the ion beam and results in the removal of material from the object. The ion beam can then likewise be used, similar to the electron beam, to generate an image of the object.

The removal of material from the object by the ion beam 9 is generally possible only at a limited rate. If a material removal that is desired is of a scope that would take up too much time at the given removal rate using the ion beam, the material removal can take place using a laser beam. The object can be transported into a processing region 13 of a laser beam 17 emitted by a laser scanner 15 in order to remove material from the object with the laser beam 17. The rate of material removal using the laser beam 17 is generally greater than that using the ion beam 9. Accordingly, relatively great material removal rates can be achievable with the laser beam 17.

The electron beam column 3 includes an electron source 21 having a cathode 23 and an anode 25, a condenser lens system 27 for generating the beam 5, a secondary electron detector 29, which is arranged for example within the column 3, and an objective lens 31 for focusing the electron beam 5 within the processing region 11. Beam deflectors 33 are provided to vary the location of incidence of the electron beam 5 on the object and for example to scan the scanning region 11 and to detect signals that are produced or released in the process, in the present exemplary embodiment secondary electrons, with the detector 29 in order to acquire an electron microscopy image of the object in the scanned scanning region 11.

The ion beam column 7 includes an ion source 39 and electrodes 41 for shaping and accelerating the ion beam 9, and beam deflectors 43 and focusing coils or focusing electrodes 45 likewise for focusing the ion beam 9 within the processing region of the electron beam column 3 and to scan it there over a region of the object.

A vacuum chamber 51 is delimited by a vacuum jacket 53, which has a pump connecting piece 55 connected to a vacuum pump and can be vented via a connecting piece 57. In order to be able to keep the electron source 21 permanently at a sufficiently good vacuum, even when process gas is introduced into the vacuum chamber 51, the electron beam column 3 includes a pressure stage stop 59 and a further pump connecting piece 61 in order to pump out the region of the electron source 21 using a separate vacuum pump. The common processing region of the electron beam column 3 and the ion beam column 7 is arranged within the vacuum chamber 51.

The laser system 15 includes a laser 71 and an optical unit 73 for shaping and focusing the laser beam 17. The laser beam 17 is guided via one or more mirrors 75 or light guides to a location in the close vicinity of the vacuum jacket 53 of the vacuum chamber 83 and is incident there on one or more pivot mirrors 77, which directs the beam to the object to be processed and is pivotable in the process, as indicated by an arrow 79, such that the beam 17 can scan the processing region 13.

In this case, the laser beam 17 enters a vacuum chamber 83 through a window 81, which vacuum chamber is likewise delimited by the chamber wall 53, but from which the vacuum chamber 51 is separable by an openable door 85. FIG. 1 shows a closure plate 87 of the door 85 in a solid line in the opened state of the door and in a dashed line in the closed state of the door 85. An actuator rod 89 of the door serves to move the closure plate 87 so as to transfer the door 85 from its opened state into its closed state, and vice versa. The door 85 can here be embodied in the form of a vacuum closure by being sealed with respect to the chamber wall 53 so as to maintain different vacuum pressures in the vacuum chambers 51 and 83. Here, the vacuum chamber 83 is evacuated via a pump connecting piece 91, which is connected to a vacuum pump, and can be vented via a further connecting piece 93.

The object to be processed is mounted on an object holder 101 and can, together with the object holder 101, be transported between two positions. A transport apparatus 103 is provided, which has a linkage 105 having, on one end, a coupling 108 with which the object holder 101 can be gripped in order to pull it from the position in which the object is arranged in the processing region of the particle beams 5 and 9 on the right in FIG. 1 into a position in which the object is arranged within the processing region 13 of the laser beam 17 on the left in FIG. 1. The object holder 101 can likewise be transported from the position that is on the left in FIG. 1 into the position that is on the right in FIG. 1 using the transport apparatus 103. The transport apparatus 103 furthermore includes a vacuum seal 107, which is provided in the vacuum jacket 53 and through which the linkage 105 passes, and which vacuum seal enables displacement of the linkage 105 for transporting the object holder 101 between its two positions without the need to vent the vacuum chambers 51 and 83. A rail 109 can furthermore be provided to carry the object holder 101 during its transport. When the object holder 101 is arranged in the position in the vacuum chamber 51 that is on the right in FIG. 1, the coupling 108 of the linkage 105 can be released from the object holder 101 so that the linkage 105 can be removed from the vacuum chamber 51 and the door 85 can be closed.

When the object holder 101 is arranged in the vacuum chamber 51, it is carried by a positioning apparatus 111, which serves to move the object holder 101 relative to the particle beams 5 and 9 in order to move selectable regions of the object into the scanning region 11 of the electron beam column 3 or the scanning region of the ion beam column 7. The positioning apparatus 111 includes a base 113 and one or more intermediate components 115, which carry a component 117 to which the object holder 101 is fastened. The components 113, 115 and 117 are movable relative to one another in order to permit a displacement of the object holder 101 in three spatial directions x, y and z, and the components can also be rotatable relative to one another in order to permit a change of orientation of the object holder 101 relative to the particle beams 5 and 9. In the position in the vacuum chamber 83 that is on the left in FIG. 1, the object holder 101 is arranged on a positioning apparatus 122, which permits positioning of the object holder 101 in the processing region 13 of the laser scanner 15. The transport apparatus 103, the positioning apparatus 111 and the positioning apparatus 122 together form a transport system for moving the object between the processing region of the particle beam columns 3 and 7 and the laser scanner 15 and for positioning desired regions of the object in the scanning regions of the particle beam columns 3 and 7 and of the laser scanner 15, respectively.

Background information relating to systems that use a plurality of particle beams and a laser beam for processing an object can be found, for example, in the publications US 2010/0051828 A1 and US 2011/0198326 A1, the disclosure of which, in the entirety thereof, is incorporated in the present application.

Figure 2:
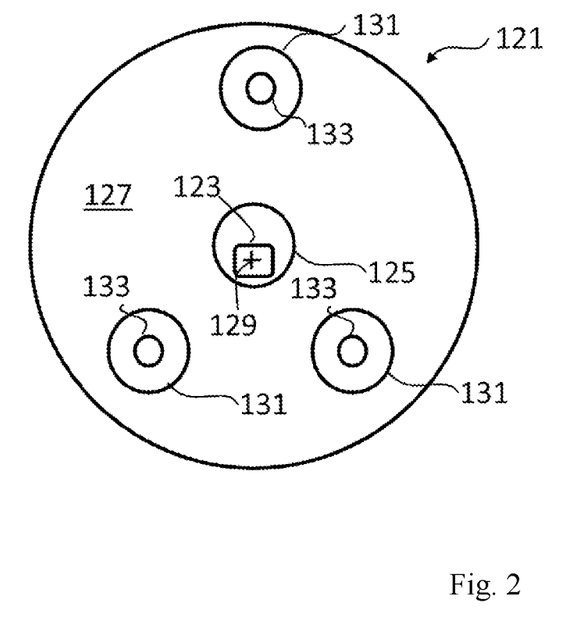
FIG. 2 shows a schematic top view of a sample holder of the material processing system shown in FIG. 1.

FIG. 2 shows a top view of an object 121, which can be mounted on the object holder 101 in order to be moved together with the object holder 101 between the processing region of the particle beam columns 3, 7 and the processing region of the laser scanner 15 using the transport apparatus 103. A sample 123, which is to be examined and can be, for example, a packaged or potted integrated circuit, is mounted on the object 121. The sample 123 is mounted on a sample holder 125, which is mounted on a mounting plate 127 of the object 121. A cross 129 in FIG. 2 symbolizes a mark that was produced on the sample 123 by the laser beam 17 of the laser scanner 15. By scanning the mark 129 with the electron beam 5, the mark 129 can be captured in an electron microscopy image that is generated in the process, and it is also possible, for example, based on such an electron microscopy image, to determine a position of the mark 129 in a coordinate system of the electron beam column 3.

Mounted on the mounting plate 127 of the object 121 are three further sample holders 131, which each provide a partial mark 133 to together form one mark that is determinable with respect to its position and orientation. The partial marks 133 each have the geometric shape of a circular disc and are detectable by scanning with the particle beams 5 and 9 and also by scanning with the laser beam 17. The circular discs are defined by holes in stop plates. By scanning with for example the electron beam of the electron beam column, the circular holes are recognizable in the resulting electron microscopy image and the positions of the stops and thus of the partial marks are likewise determinable in the coordinate system of the electron beam column 3. The light travelling through the circular holes in the stop plates is diverted to a light detector 151 (see FIG. 1). The latter emits a signal as soon as the laser beam 17 scanning the respective partial mark 133 overlaps with the opening in the stop plate. It is also possible that in each case a photodetector (not shown in FIG. 2) is arranged below each of the circular holes in the stop plates. By evaluating the signals provided by the photodetector in dependence on the scanning positions of the laser beam 17, it is thus possible to determine the positions of the stops or of the partial marks 133 in the coordinate system of the laser scanner 15. Details concerning marks that are detectable both by the laser scanner 15 and also by the particle beam column 3, 7 can be found in the aforementioned US 2011/0198326 A1. Other implementations of such marks are possible. For example, a layer that has been deposited on the surface of the object and is made from a reflective material, for example a layer made from gold that is deposited in a region having the shape of the letter "L", can serve as such a second mark, wherein the laser scanner includes a light detector that detects light when the laser beam is directed at the reflective layer.

Figure 3:
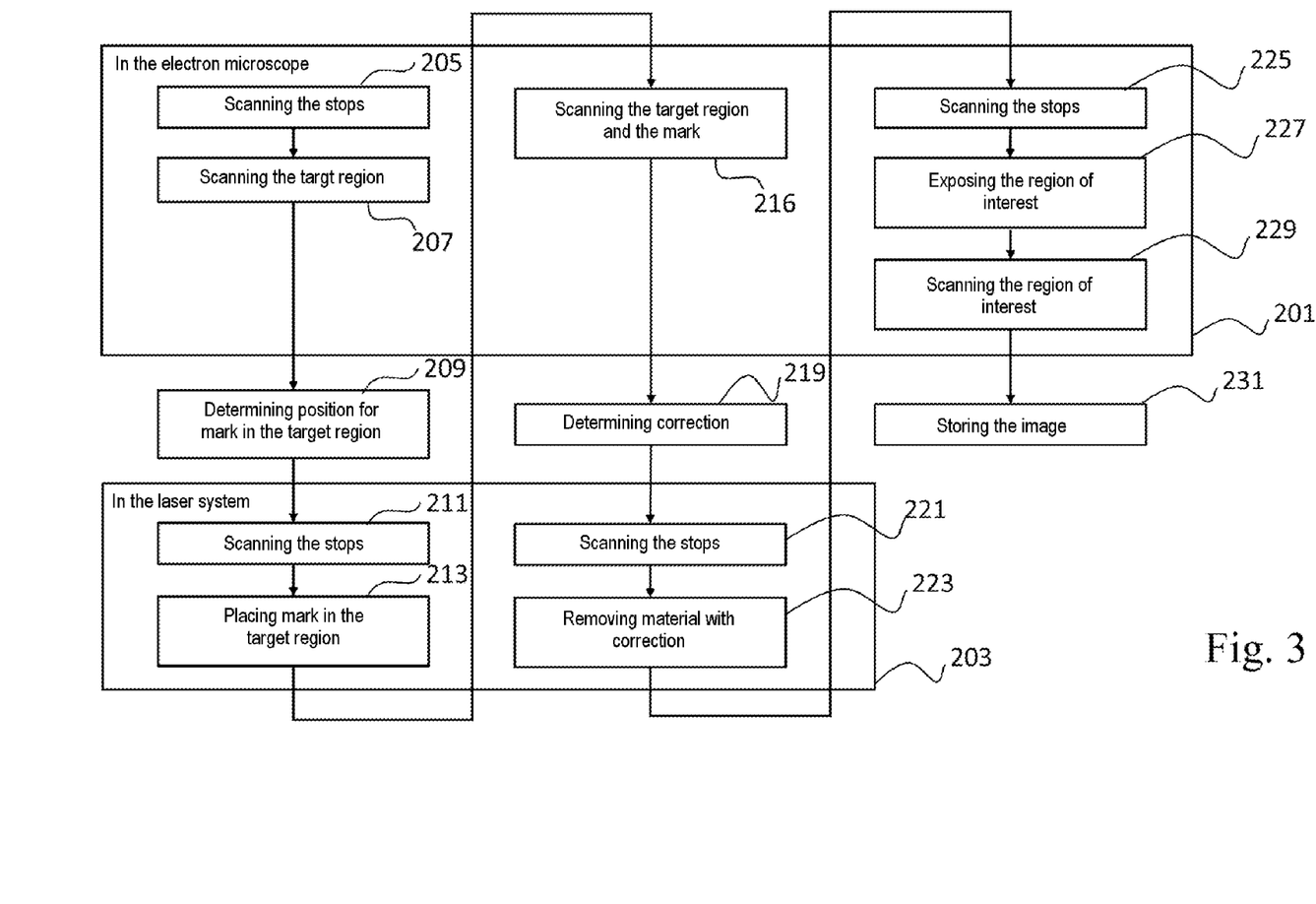
FIG. 3 shows a flowchart for explaining the material processing method according to an embodiment.

A material processing method according to a first embodiment, which is performable using the material processing system 1, will be explained below with reference to the flowchart shown in FIG. 3. The method includes a plurality of steps in which the sample 123 is arranged in the processing region of the electron beam column 3 and the ion beam column 7. The steps are shown in FIG. 3 within a rectangle 201. The method further includes a plurality of steps in which the sample 123 is arranged in the processing region 13 of the laser scanner 5. The steps are shown in FIG. 3 within a rectangle 203.

It is assumed that the sample 123 is a packaged integrated circuit containing an electronic circuit element, such as a transistor, of which an electron microscopy image is intended to be generated. This circuit element thus forms a region of interest within the packaged integrated circuit. The position of the region of interest relative to an outer surface of the integrated circuit is known from a CAD model of the integrated circuit. The method begins with the sample 123 being attached to the sample holder 125 and the sample holder 125 being mounted on the mounting plate 127 of the object 121. The sample holders 131 with the partial marks 133 are likewise mounted on the mounting plate 127.

Next, the object 121 is mounted on the object holder 101 and is arranged in the processing region of the electron beam column 3 by the transport system. Subsequently, in a step 205, the three partial marks 133 are scanned that together form a first mark, which can also be scanned by the laser scanner 17. Since the three partial marks 133 are arranged on the sample holders 131 with a large distance between one another, not all three partial marks 133 fit into the scanning region 11 of the electron beam column 3 at the same time. For that reason, the positioning apparatus 111 is actuated after one of the partial marks 133 has been scanned in order to bring the respectively next partial mark 133 into the scanning region 11 of the electron beam column 3. Once the three partial marks 133 have been scanned and their positions in the coordinate system of the electron beam column 3 have been determined, the position and the orientation of the first mark, consisting of the three partial marks 133, can also be determined in the coordinate system of the electron beam column 3.

Next, in a step 207, a target region at the sample 123 is scanned with the electron beam 5, after the target region has been moved into the scanning region 11 of the electron beam column 3 by actuating the positioning apparatus 111. The target region is a part of the surface of the sample 123 under which the region of interest is arranged. By using the CAD model of the sample 123, in a step 209, a location within the target region at which the second mark 129 is to be placed is determined. This position can be determined both in the coordinate system of the electron beam column 3 and also in the coordinate system of the object 121, that is to say relative to the positions of the partial marks 133 forming the first mark. Owing to the target region being scanned with the electron beam, the position relative to the target region is likewise given and known.

Subsequently, the object 121 is moved by the transport system into the processing region 13 of the laser scanner 15. In a step 211, the first mark formed by the partial marks 133 is scanned by the laser beam 17, and the position and the orientation of the first mark in the coordinate system of the laser scanner 15 is determined. Next, in a step 213, the second mark 129 is produced at the position of the location in the target region that was determined in step 209. The second mark 129 can have, for example, the shape of a cross, and the mark can be produced by scanning the shape of the cross with the laser beam by virtue of material being removed from the sample along the path that is travelled here by the laser beam.

Next, the object 121 is transported back into the processing region of the particle beam column 3, 7, specifically in a manner such that the target region is arranged in the scanning region of the electron beam column 3. Then, in a step 216, the target region is scanned, wherein the second mark 129 produced by the laser beam is likewise scanned. It is possible for example to generate an electron microscopy image of the target region from the electrons detected during the scanning, wherein the image also contains the imaged presentation of the second mark 219. Next, the position of the second mark 219 relative to the target region is determined and compared with the position that was determined in step 209 relative to the target region. In a step 219, a correction for the processing with the laser beam 117 is determined from the difference between the two positions.

Subsequently, the object 121 is transported back into the processing region 13 of the laser scanner 15, and, in a step 221, the partial marks 133 forming the first mark are again scanned with the laser beam 17 in order to determine the position of the first mark in the coordinate system of the laser scanner 15. Subsequently, the laser beam 17 is operated to remove material from the sample 123 up to the close vicinity of the region of interest. The laser beam 17 is here controlled based on the CAD model of the sample, wherein the correction determined in step 219 is used, by which deviations between the position at which the laser beam is in each case perceived to be directed and the position at which the laser beam is actually incident are compensated.

The material volume that is removed is determined, based on the CAD model of the sample, such that a material layer is kept as security between the surface of the remaining material and the region of interest. The thickness of the material layer is selected such that, even if too much material is removed due to expected errors when controlling the material removal, no material is removed from the region of interest. Owing to the correction determined in step 219, the thickness of the material layer can be selected to be comparatively small.

Subsequently, the object 121 is transported back into the processing region of the particle beam columns 3 and 7. In a step 225, the first mark formed from the partial marks 133 is again scanned with the electron beam 5. Subsequently, in a step 227, the material layer that was kept in step 223 in front of the region of interest is removed with the ion beam 9. Since the material layer that is to be removed with the ion beam 9 has merely a small thickness due to the correction determined in step 219, this removal of material with the ion beam 9 is possible within a comparatively short amount of time.

Next, in a step 229, the desired region of interest is scanned with the electron beam 5 in order to generate an electron microscopy image of the region of interest. This image can be stored in a storage medium in a step 231.

Figure 4:
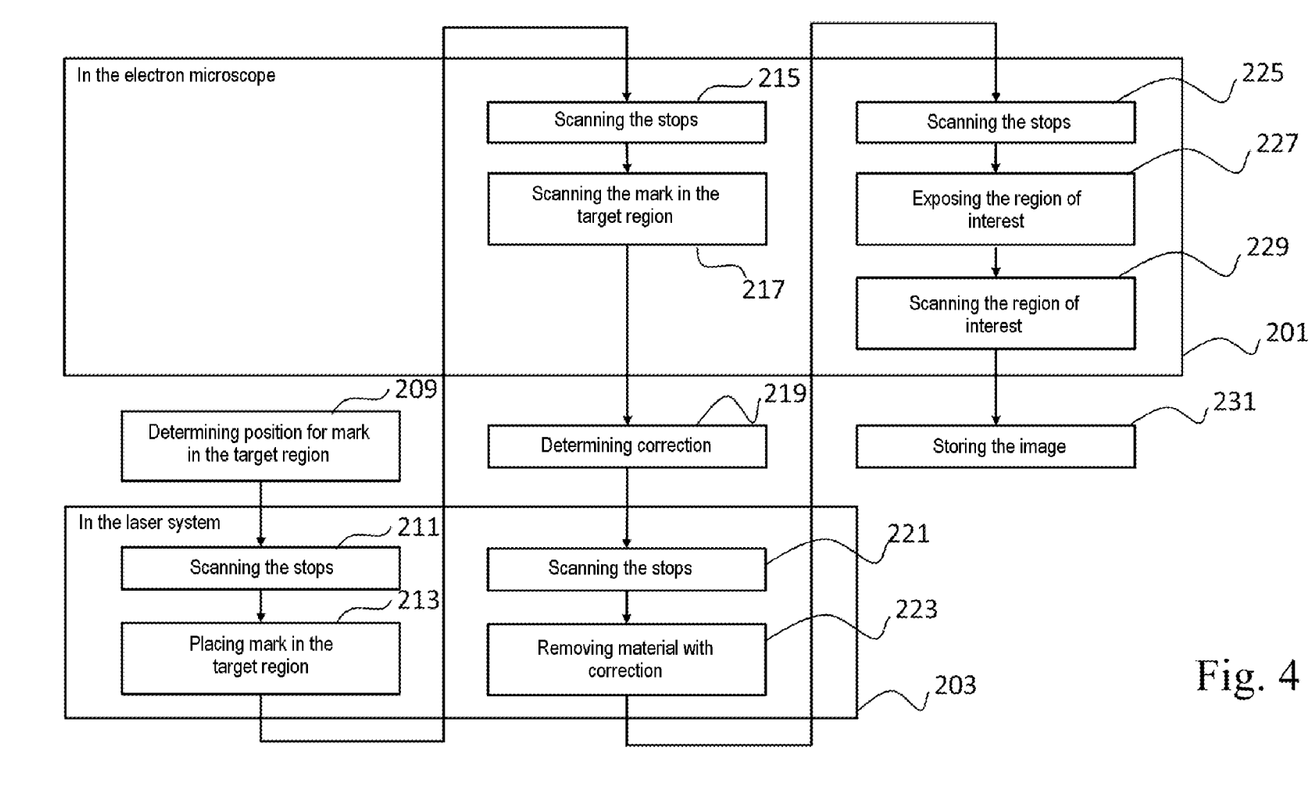
FIG. 4 shows a flowchart for explaining the material processing method according to an embodiment.

With reference to FIG. 4, a second embodiment of the method will be explained below. This method is largely similar to the method of the first embodiment explained with reference to FIG. 3. Certain ways the method steps in which the method of the second embodiment differs from that of the first embodiment will be explained below, while the steps in which the two methods are alike will not be explained again so as to avoid repetitions and are denoted with the same reference signs. For the purposes of understanding these steps, reference should be made to the description of the first embodiment belonging to FIG. 3.

The method of the second embodiment differs from that of the first embodiment substantially in that, before steps 211 and 213 for producing the second mark in the target region using the laser beam, the object 121 is not brought into the processing region of the electron microscope to scan the stops and the target region with the electron microscope (steps 205 and 207 of the first embodiment). Rather, the object 121 is brought immediately into the processing region of the laser scanner. It is assumed here that a sufficiently exact knowledge of the position of the target region relative to the first marks 133, that is to say the stops, exists in order to determine, in a step 209, a position for the second mark in the target region relative to the stops. Accordingly, in a step 211, the partial marks 133 are then scanned with the laser beam in order to reference the coordinate system of the object 121 relative to that of the laser scanner. Next, in a step 213, a mark is placed with the laser beam on the object 121 at the position determined in step 209.

Subsequently, the object 121 is transported into the processing region of the particle beam column 3, 7, and, in a step 215, the partial marks 133 are scanned in order to determine the position and orientation of the first mark in the coordinate system of the electron beam column 3. Next, the target region on the sample 123 is scanned with the electron beam 5 to detect the second mark 129. Next, the position of the second mark 129 relative to the first mark is determined and compared with the position that was determined in step 209. In a step 219, a correction for the processing with the laser beam 117 is determined from the difference between the two positions, whereupon the method is continued like that of the first embodiment.

In the method of the first and the second embodiment, it is possible, after determining the correction in step 219, to determine a position of a further second mark in the target region according to step 209 and to produce such a second mark in the target region with the laser beam taking into account the correction. This further, second correction is then scanned with the electron microscope in a step corresponding to steps 216 or 217 in order to obtain an improved correction in a step corresponding to step 209, which improved correction is then subsequently used during the removal of material with the laser beam in a step corresponding to step 223 for controlling the laser beam in order to further increase the accuracy of the removal of material. Further repetitions for iteratively improving the correction are possible.

What is claimed is:

1. A method of using a material processing system which comprises a particle beam column configured to direct a particle beam at a first processing region and a laser scanner configured to direct a laser beam at a second processing region, the method comprising:
    scanning a first mark placed on an object with the particle beam;
    scanning the first mark with the laser beam a first time and producing a second mark on the object with the laser beam;
    scanning the second mark with the particle beam; and
    scanning the first mark with the laser beam a second time and removing material of the object with the laser beam based on the scanning of the second mark with the particle beam.

2. The method of claim 1, wherein scanning the first mark with the laser beam the first time comprises determining a position of the first mark in a coordinate system of the laser scanner.

3. The method of claim 1, wherein producing the second mark comprises:
    fixing a location in the coordinate system of the laser scanner based on scanning the first mark with the laser beam; and
    directing the laser beam at the location determined in the coordinate system of the laser scanner.

4. The method of claim 3, wherein fixing the location in the coordinate system of the laser scanner is further based on a model of a geometry of at least one part of the object.

5. The method of claim 1, wherein scanning the first mark with the particle beam the first time comprises determining a position of the first mark in a coordinate system of the particle beam column.

6. The method of claim 1, wherein scanning the second mark with the particle beam comprises determining a position of the second mark in the coordinate system of the particle beam column.

7. The method of claim 1, further comprising determining a position of the second mark relative to the first mark based on the first scanning of the first mark with the particle beam and the scanning of the second mark with the particle beam.

8. The method of claim 1, further comprising:
    fixing a location relative to a position of the first mark, which is determined based on the first scanning of the first mark with the laser beam, in the coordinate system of the laser scanner;
    directing the laser beam at the location to produce the second mark; and
    determining a position of the second mark relative to the first mark based on the first scanning of the first mark with the particle beam and the scanning of the second mark with the particle beam,
    wherein removing material of the object with the laser beam is based on a difference between the second position and the first position.

9. The method of claim 1, further comprising:
    scanning the first mark with the particle beam a second time and scanning at least one part of the object with the particle beam before first scanning the first mark with the laser beam and before producing the second mark;

fixing a position relative to a position of the first mark, which is determined based on the second scanning of the first mark with the particle beam, based on the scanning of the part of the object with the particle beam;

fixing a location in the coordinate system of the laser scanner based on the scanning of the first mark with the laser beam and the fixed position; and directing the laser beam at the fixed position in order to produce the second mark.

10. The method of claim 1, further comprising removing material of the object with the particle beam after removing material of the object with the laser beam.

11. The method of claim 10, wherein the particle beam comprises an ion beam.

12. The method of claim 1, further comprising:

scanning at least one part of the object with the particle beam after removing material of the object with the laser beam; and detecting signals generated based on the scanning on the object.

13. The method of claim 12, wherein the particle beam comprises an electron beam.

14. The method of claim 12, further comprising:

generating an image based on the detected signals; and presenting the generated image using a display medium and/or storing the generated image in a storage medium.

15. The method of claim 1, wherein the object comprises a sample holder and a sample held at the sample holder.

16. The method of claim 15, wherein the first mark is held at the sample holder separately from the sample.

17. The method of claim 1, wherein the first mark comprises an aperture and a light detector.

18. The method of claim 1, wherein the processing system further comprises a transport system configured to transport the object from the first processing region to the second processing region and to transport it from the second processing region to the first processing region.

19. The method of claim 1, wherein the transport system is configured to move the object relative to the particle beam column, and the method further comprises:

moving the object relative to the particle beam column so that the first mark is arranged in a scanning region of the particle beam column, before first scanning the first mark with the particle beam; and moving the object relative to the particle beam column so that the second mark is arranged in the scanning region of the particle beam column, before scanning the second mark with the particle beam.

20. The method of claim 1, wherein the particle beam comprises an electron beam, and the material processing system comprises a further particle beam column configured to direct an ion beam at the first processing region.

* * * * *

UNITED STATES PATENT AND TRADEMARK OFFICE
CERTIFICATE OF CORRECTION

| | |
|---|---|
| PATENT NO. | : 12,280,445 B2 |
| APPLICATION NO. | : 17/556070 |
| DATED | : April 22, 2025 |
| INVENTOR(S) | : Stephan Hiller |

It is certified that error appears in the above-identified patent and that said Letters Patent is hereby corrected as shown below:

In the Drawings

Sheet 3 of 4, Reference Numeral 207, Fig. 3, Line 1, delete "targt" and insert -- target --.

Signed and Sealed this
Tenth Day of June, 2025

Coke Morgan Stewart
*Acting Director of the United States Patent and Trademark Office*